United States Patent
Montena (10) Patent No.: US 8,022,795 B2
(45) Date of Patent: Sep. 20, 2011

(54) VARIABLE IMPEDANCE ADAPTER FOR TUNING SYSTEM PERFORMANCE

(75) Inventor: Noah Montena, Syracuse, NY (US)

(73) Assignee: John Mezzalingua Associates, Inc., E. Syracuse, NY (US)

( * ) Notice: Subject to any disclaimer, the term of this patent is extended or adjusted under 35 U.S.C. 154(b) by 231 days.

(21) Appl. No.: 12/418,045

(22) Filed: Apr. 3, 2009

(65) Prior Publication Data

US 2010/0253444 A1    Oct. 7, 2010

(51) Int. Cl.
*H03H 7/38* (2006.01)

(52) U.S. Cl. .................. 333/263; 333/17.3

(58) Field of Classification Search .......... 333/263, 333/33, 35, 17.3
See application file for complete search history.

(56) References Cited

U.S. PATENT DOCUMENTS

| | | | |
|---|---|---|---|
| 3,374,449 A | 3/1968 | Moore et al. | |
| 3,440,573 A | 4/1969 | Butler | |
| 3,792,385 A * | 2/1974 | Napoli et al. | 333/224 |
| 4,917,630 A | 4/1990 | Hubbard | |
| 4,943,245 A | 7/1990 | Lincoln | |
| 5,329,262 A | 7/1994 | Fisher, Jr. | |
| 5,474,470 A | 12/1995 | Hammond, Jr. | |
| 6,140,888 A | 10/2000 | Sarkka et al. | |
| 6,664,868 B1 * | 12/2003 | Echols, Jr. | 333/33 |
| 6,856,211 B2 | 2/2005 | Yamada et al. | |
| 6,863,565 B1 | 3/2005 | Kogan et al. | |

* cited by examiner

*Primary Examiner* — Stephen E Jones

(74) *Attorney, Agent, or Firm* — Schmeiser, Olsen & Watts, LLP

(57) ABSTRACT

A variable impedance adapter that has a value of characteristic impedance that is responsive to changes in the configuration of the adapter. In one embodiment, the variable impedance adapter includes an elongated section and a telescoping section that surround a center conductor that transmits an electrical signal across the adapter. A pair of tuning elements is disposed on a portion of the center conductor, one or more of the elements being shaped and configured to move along the center conductor amongst a plurality of positions in response to relative movement between the elongated section and the telescoping section. The first position and the second position correspond to different values of characteristic impedance of the variable impedance adapter.

9 Claims, 6 Drawing Sheets

FIG. 7

VARIABLE IMPEDANCE ADAPTER FOR TUNING SYSTEM PERFORMANCE

FIELD OF THE INVENTION

The invention relates to electrical connectors and adapters, and more specifically, to electrical connectors and adapters that have a value of characteristic impedance that is adjustable so as to facilitate tuning the performance of a system.

BACKGROUND OF THE INVENTION

Cable/broadband, telecom, wireless, and satellite industries connect a variety of electrical components, e.g., antennas, amplifiers, diplexers, surge arrestors, with transmission lines, and adapters, to form systems that transmit alternating current electrical signals that can be arranged in an analog and/or digital format. One measure of the success of these systems is the efficiency with which the electrical signals are transmitted amongst these components. Engineers, designers, and technicians in these industries, however, are aware that the level of transmission efficiency that is attained is dependent, in part, on the physical properties of the components that are used in their construction.

Characteristic impedance is one of these properties. More particularly, differences in the characteristic impedance of the components that are connected together can cause problems that affect the transmission efficiency. For example, in a system that includes an antenna, an amplifier, and a transmission line, the differences in the characteristic impedance of the antenna, the amplifier, and the transmission line can cause a portion of the electrical signal transmitted from the amplifier to the antenna to reflect back to the amplifier. This, in turn, can cause standing wave patterns to form in the transmission line when the electrical signal transmitted from the amplifier to the antenna reacts with the electrical signal reflected from the antenna to the amplifier.

Impedance matching is one way to alleviate some of these problems. The goal is to create a system that has a substantially uniform characteristic impedance, which for many systems of the type disclosed and contemplated herein is nominally about 50 ohm, 75 ohm or 90 ohm. Characteristic impedance values that are exhibited by each of the transmission lines and the adapters are determined by a variety of factors, such as, for example, the geometry of the transmission line, the geometry of the adapter structure, and the corresponding dielectric material between the conductors. Similarly, the value of characteristic impedance for the adapter can be calculated according to the Equation 1 below, $$Z=\sqrt{Z_1 \times Z_2}, \quad \text{Equation (1)}$$

where Z is the characteristic impedance of the adapter, and $Z_1$ and $Z_2$ are the values of characteristic impedance for various components in the system. Accordingly, creating a system having substantially uniform characteristic impedance includes matching the characteristic impedance values of the transmission lines, e.g., coaxial cable, and the adapters that electrically couple the conductors of the transmission lines with other transmission lines, and with the electrical components.

Unfortunately, although mismatches in the characteristic impedance of the transmission lines and the adapters can degrade the quality of the electronic signal, these mismatches are essentially inevitable. In fact, constraints on cost, manufacturing tolerances, and material selection, among other limitations, cause many adapters that are presently available to exacerbate the problem. Despite these issues, efforts that are directed to better balance the value of characteristic impedance of the components, transmission lines, and in particular the adapters, throughout the system have thus far been unsatisfactory, or have resulted in rigid solutions with limited application in systems utilizing higher frequency regimes.

Therefore, a adapter is needed that can facilitate impedance balancing amongst the electrical components in these systems, and more particularly, that can help balance the mismatches in high frequency systems so as to improve signal transmission. It is likewise desirable that, in addition to being configured to support a range of values of characteristic impedance, this adapter is robust enough so that it can be implemented in a variety of systems and applications.

SUMMARY OF THE INVENTION

The present invention will substantially improve the efficiency that electrical signals are transmitted amongst the components in a system. As discussed in more detail below, adapters that are made in accordance with the present invention have a value of characteristic impedance that is adjustable so that the value can be matched the nominal value of characteristic impedance of a system.

In accordance with one embodiment, an adapter for transmitting an electrical signal between a plurality of components in a system, the adapter comprising a center conductor having a longitudinal axis, an adapter body disposed in surrounding relation to the center conductor, and a plurality of tuning elements disposed in a spaced relationship along a portion of the center conductor and having a volumetric shape with a width W, at least one of the tuning elements having a plurality of positions on the center conductor including a first position and a second position that is different that the first position, the second position corresponding to a value for the spaced relationship that is less than the sum of the width W of each of the tuning elements.

In accordance with another embodiment, an adapter for connecting a pair of transmission lines in a system having a nominal value of characteristic impedance, each of the transmission liens in electrical communication with a component in the system, the adapter comprising a center conductor having a longitudinal axis, a first elongated section in surrounding relation to the center conductor, a second elongated section insertably engaging the first elongated section along the longitudinal axis, and a plurality of tuning elements disposed in a spaced relationship on a portion of the center conductor and having a volumetric shape with a width W, at least one of the tuning elements having a plurality of positions on the center conductor including a first position and a second position that is different than the first position, the second position corresponding to a value for the spaced relationship that is less than the sum of the width W of each of the tuning elements.

In accordance with still another embodiment, a method of varying a value of characteristic impedance of an adapter for connecting a first component and a second component in a system having a nominal value of characteristic impedance, the method comprising providing a center conductor having a longitudinal axis, providing an adapter body in surrounding relation to the center conductor, the adapter body including a first elongated section and a second elongated section insertably engaging the first elongated section, and aligning a plurality of insulating elements on the center conductor in a spaced relationship along the longitudinal axis, each of the insulating elements having a volumetric shape with a width W, at least one of the tuning elements having a plurality of positions on the center conductor including a first position and a second position that is different than the first position, the second position corresponding to a value for the spaced relationship that is less than the sum of the width W of each of the tuning elements.

BRIEF DESCRIPTION OF THE DRAWINGS

For a further understanding of the nature and objects of the invention, references should be made to the following detailed description of a preferred mode of practicing the invention, read in connection with the accompanying drawings in which.

DETAILED DESCRIPTION OF THE INVENTION

Figure 1:
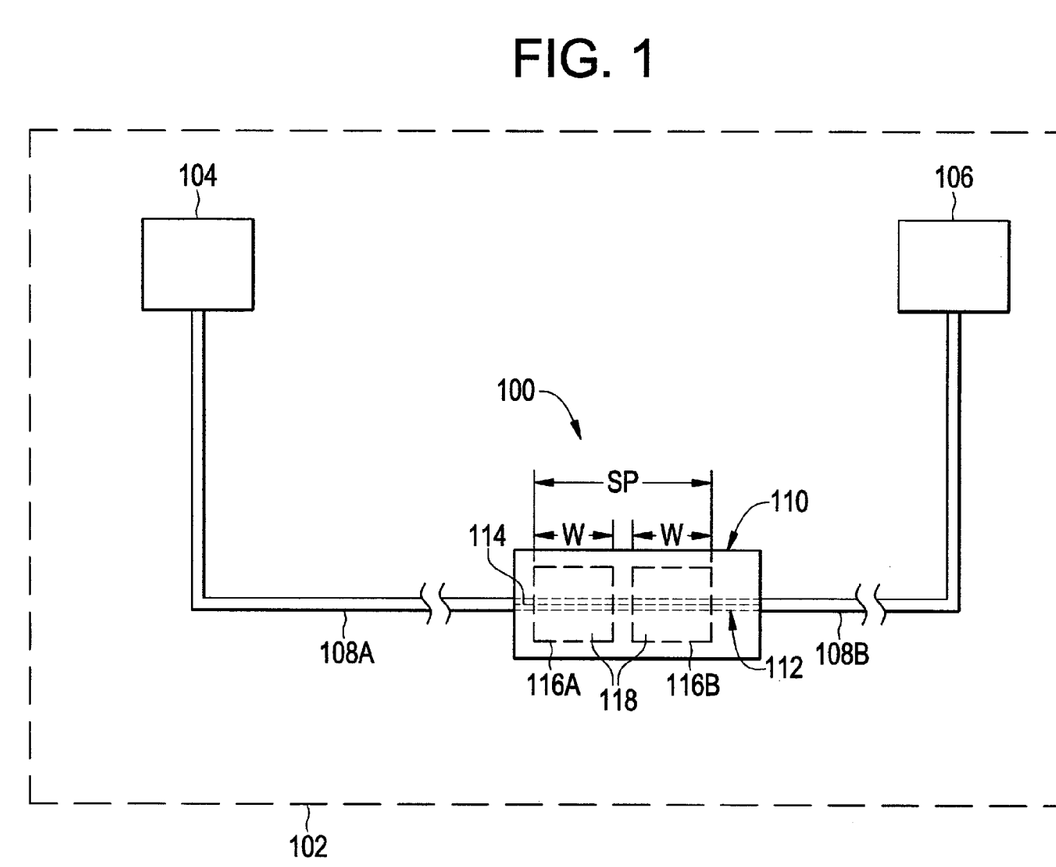
FIG. 1 is schematic of a system that includes an example of a variable impedance adapter.

Referring now to the figures, FIG. 1 illustrates an example of a variable impedance adapter 100 that is made in accordance with concepts of the present invention. In the present example, the adapter 100 is implemented in a system 102 that includes a first component 104 and a second component 106 that is connected to the first component 104 via a transmission line 108, e.g., transmission lines 108A-B. Exemplary components that are found in systems like system 102 include, but are not limited to, antennas, diplexers, surge arrestors, and amplifiers, as well as other components, like, tuners, radios, oscilloscopes, and any combinations thereof. These are often connected with transmission lines, e.g., transmission line 108A-B, that are typically signal-carrying conductors such as, for example, coaxial cable, shielded cable, optical fiber cable, multi-core cable, ribbon cable, and twisted-pair cable, among others. Selection of the transmission line can vary based on the system in which it is implemented, and so it is expected that the adapter 100 will have relative dimensions that are consistent with, and complimentary to, the particular type of transmission line that is selected for transmission lines 108A-B. Many of the components and corresponding transmission lines, as well as other components that are not listed or discussed herein but that are contemplated by the concepts of the present disclosure, are found in high frequency systems, such as, for example, antenna systems for wireless devices, satellite links, microwave data links, radio astronomy devices, cellular telephone tower installations, and the like.

Conventional adapters often have a value of characteristic impedance that is different than a nominal value of characteristic impedance of the system. The nominal value is generally about 50 ohm, 75 ohm, or 90 ohm. As discussed in the Background section above, the difference between the value of characteristic impedance of the adapter and the nominal value of characteristic impedance for the system can substantially reduce the efficiency that the electrical signals, e.g., analog and/or digital signals, are communicated throughout the system. Embodiments of the adapter 100, on the other hand, have a value of characteristic impedance that varies in accordance with changes in the configuration of the adapter 100. This is beneficial because adapters used as adapter 100 can be tuned in a manner that causes the value of the characteristic impedance of the adapter 100 to move toward the nominal value of the system.

In view of the foregoing, embodiments of the variable impedance adapter 100 include an adapter body 110 and a center conductor 112 that has a longitudinal axis 114 that is effectively surrounded by the adapter body 110. The adapter 100 also includes a plurality of tuning elements 116, e.g., tuning elements 116A-B, that are disposed in a spaced relationship SP along a portion of the center conductor 112. Preferably, but not necessarily, each of the tuning elements 116A-B surrounds the center conductor 112 so as to insulate a portion of the center conductor 112 from the adapter body 110.

The adapter 100 is generally elongated in shape, with preferred construction of the adapter body 110 including one or more elongated cylindrical sections that interleave, or overlap, to form a substantially rigid outer shell. These sections may move relative to one another so that the relative movement changes the position of one or more of the tuning elements 116 on the center conductor 112. The center conductor 112 conducts electrical signals across adapter 100, such as, for example, between the transmission lines 108A-B. Depending on the particular application, the center conductor 112 is metallic, e.g., copper, aluminum, gold, etc., and may have a number of conductive sections that are solid or hollow. Each of the conductive sections are generally electrically coupled to one or more of the other conductive sections, with one preferred construction of center conductor 112 of the adapter 100 that has the sections mechanically coupled to the adapter body 110 so that, for example, the relative movement of the elongated cylindrical sections causes relative movement of the conductive sections without the loss of electrical signal conduction.

Examples of tuning elements of the type used as tuning elements 116 have certain physical properties that can influence the value of characteristic impedance of the adapter 100. In one example of the tuning element 116, at least a portion of the tuning element 116 is made of dielectric materials, such as, but not limited to, polycarbonate, polyethylene, TEFLON®, ULTEM®, and any combination thereof. Air is also a suitable material, such as, for example, if the adapter body 110 does not include any tuning elements 116. In other examples, one or more of the tuning elements of the adapter 100 may be made of a compressible material, which permits the width W of the volumetric body 118 to change by, for example, applying an exterior force to the outer surfaces of the tuning element 116.

As illustrated in the example of adapter 100 of FIG. 1, each of the tuning elements has a volumetric shape 118 that has a width W extending along the longitudinal axis 114. Although the volumetric shape 118 can vary, it is generally selected so that the tuning element 116 insulates the center conductor 112 uniformly about the longitudinal axis 114. Exemplary shapes include, but are not limited to, cylinders, and cubes, among others. In one embodiment of the adapter 100, the volumetric shape 118 is configured in a manner that permits the tuning elements 116A-B to intermesh, or overlap, so that the spaced relationship between the tuning elements 116A-B is less than the sum of the width W of each of the tuning elements 116. This concept is illustrated in more detail in connection with FIGS. 2 and 3 below.

Figure 2:
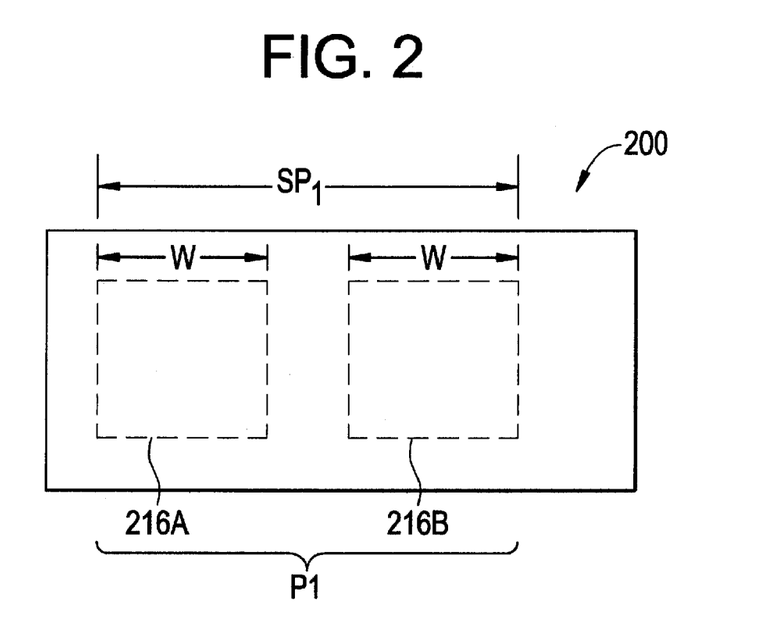
FIG. 2 is a schematic of another example of a variable impedance adapter that includes a pair of insulating elements in a spaced relationship.
Figure 3:
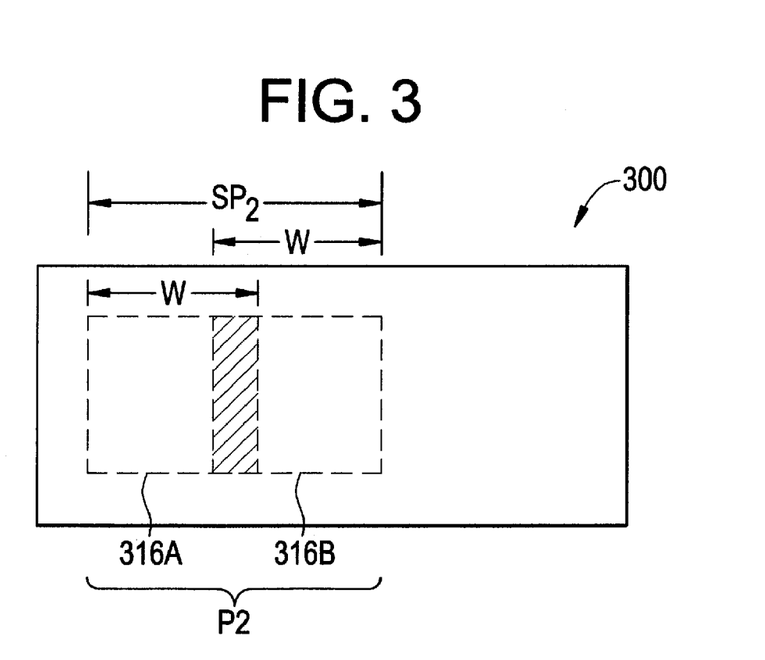
FIG. 3 is a schematic of yet another example of a variable impedance adapter that includes a pair of insulating elements in a spaced relationship that is different from the spaced relationship of the tuning elements of the variable impedance adapter of FIG. 2.

More particularly, and with reference to FIGS. 2-3, and also FIG. 1, in certain embodiments of the variable impedance adapter, changes in the spaced relationship SP correspond to changes in the position of one or more of the tuning elements 116 in the adapter 100. This, in turn, may cause the value of the characteristic impedance of the adapter 100 to change by an amount consistent with the change in the spaced relationship SP. For example, FIGS. 2-3 illustrate examples of an adapter 200, 300, where some of the portions of the system, e.g., system 102, have been removed for clarity, and where like numerals are used to identify like components, such as those components discussed in connection with FIG. 1 above, but that the numerals are increased, respectively, by 100, and 200. In the example of the adapter 200 in FIG. 2, it is seen that the tuning elements 216, e.g., tuning elements 216A-B, are in a first position P1 that corresponds to a first spaced relationship SP1. SP1 may cause a value of characteristic impedance for the adapter 200, such as, for example, a first value of characteristic impedance that is different than the nominal value of characteristic impedance for the system (not shown). Turning next to the example of the adapter 300 of FIG. 3, the tuning elements 316, e.g., tuning elements 316A-B, are in a second position P2 that corresponds to a second spaced relationship SP2 where the second spaced relationship SP2 is less than the sum of the widths of the tuning elements 316A-B. In the present example of FIG. 3, this is because a portion of the tuning element 316B is intermeshed with a portion of the tuning element 316A. SP2 may cause a second value of characteristic impedance for the adapter 300 that is different from the first value of the adapter 200 in FIG. 2.

Figure 4:
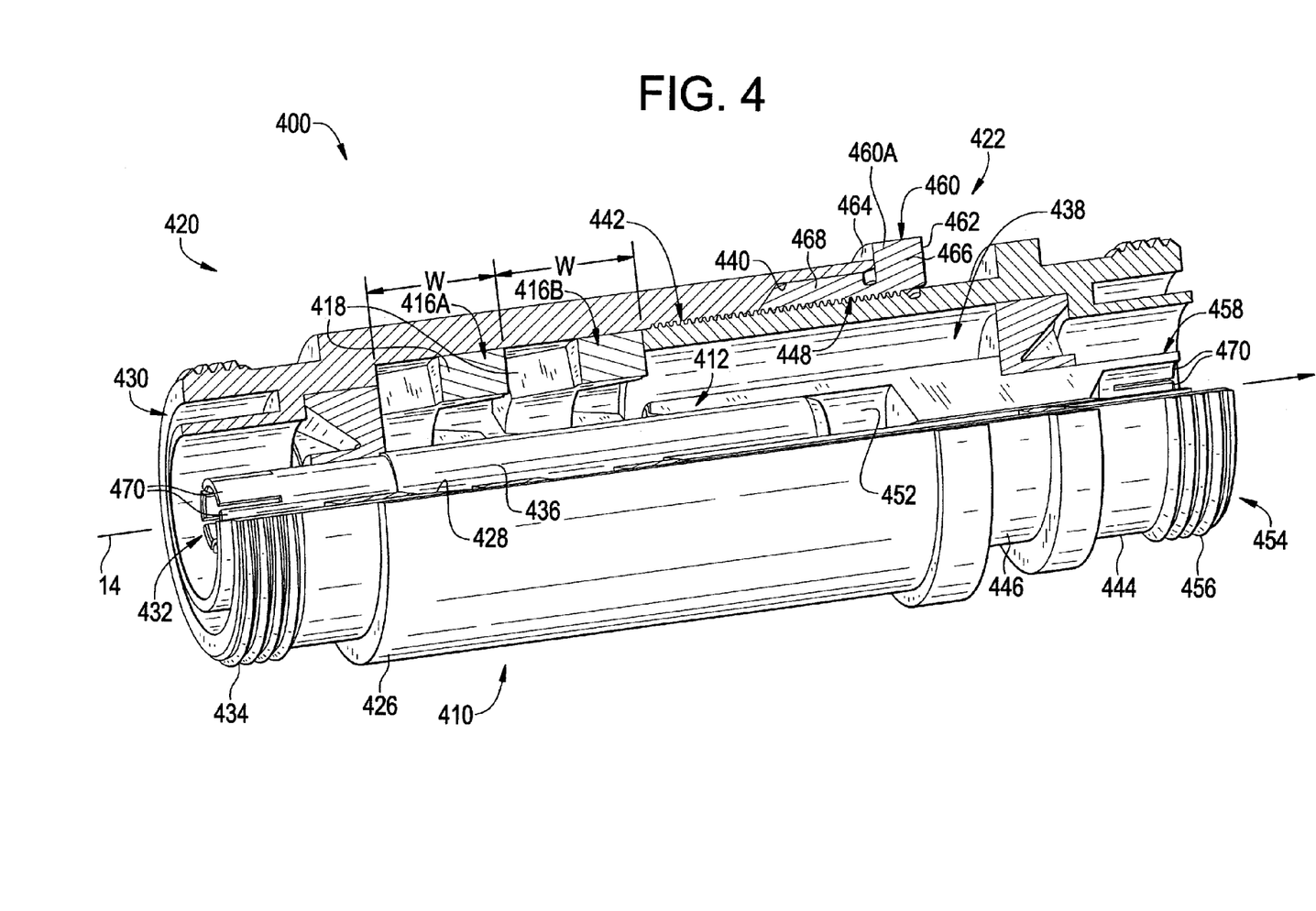
FIG. 4 is a perspective view of a partial cross-section of still another example of a variable impedance adapter.

Referring next to FIG. 4, FIG. 4 illustrates another example of an adapter 400 that is made in accordance with concepts of the present invention. Again, as mentioned in connection with FIGS. 2 and 3 above, some of the portions of the system, e.g., system 102 (FIG. 1), have been removed for clarity, and like numerals are used to identify like components, such as those components in FIGS. 1-3 above, but that the numerals are increased, respectively, by 100, 200, and 300. In the present example, the adapter 400 of FIG. 4 includes an adapter body 410, a center conductor 412, and a longitudinal axis 414. The adapter 400 also includes a plurality of tuning elements 416, e.g., 416A-B, each of which have a volumetric shape 418 with a width W.

The adapter 400 further includes a fixed side 420 and a telescoping side 422 that is opposite of the fixed side 420 of the adapter 400. It is understood that the terms "fixed side" and "telescoping side" are used herein to refer to opposite ends of an element or object, e.g., the adapter 400, and do not limit the scope and extent of the present disclosure. Rather, and as discussed in connection with the embodiment of the adapter 100 of FIG. 1, parts of the adapter 400, and more particularly, some parts of the adapter body 410 are configured so that they can move relative to other parts of the adapter 400. This relative movement, while generally being defined as that motion between these parts, will in some embodiments include one part of the adapter 400, e.g., the telescoping side 422, that moves in relation to another part of the adapter 400, e.g., the fixed side 420.

Referring first to the fixed side 420 of the adapter 400, the adapter body 410 includes a substantially cylindrical elongated section 426 that has a bore 428 that can receive the tuning elements 416 therein. The elongated section 426 includes a connective end 430 that has a conductive terminal 432 and a connective element 434 that are near the fixed side 420. The elongated section 426 also includes a fixed conductor 436 that is coupled to the elongated section 426 so that it is in electrical communication with the conductive terminal 432.

On the telescoping side 422, the elongated section 426 has an open end 438 that has a thinned portion 440 where the diameter of the bore 428 increases as the bore 428 extends towards the open end 438. The bore 428 also has threads 442, which in the present example extends into the bore 428 from the thinned portion 440. The adapter body 410 includes a telescoping section 444 that has a substantially cylindrical inner portion 446 that is insertably received in the bore 428, via the open end 438 of the elongated section 426. The inner portion 448 has threads 450 that threadedly engage the threads 442 of the bore 428. The inner portion also includes a conductive aperture 452 that receives the fixed conductor 436. The telescoping section 444 also includes a connective end 454 that has a connective element 456, and a conductive terminal 458 that is in electrical communication with the conductive aperture 452.

Optionally, the adapter 400 also includes a threaded element 460, e.g., threaded nut 460A, that surrounds at least a portion of the telescoping section 442. By way of non-limiting example, the threaded nut 460A is illustrated in the present example as internally threaded so that it can engage the threads 450 of the cylindrical inner portion 446. More particularly, the threaded nut 460A has a first side 462 and a second side 464 that is proximate the open end 438 of the elongated section 426. The threaded nut 460A is generally cylindrically shaped and has a shoulder 466 and an annular body 468 that is dimensioned so that it can fit into the thinned portion 438 of the elongated section 426. Although it is illustrated as having a smooth, annular surface, the shoulder 466 may be generally hex-shaped so as to enable the threaded nut 460A to be grasped and manipulated by hand or by a tool (not shown) so as to prevent relative movement between the elongated section 426 and telescoping sections 442.

Exemplary connective elements for use as connective elements 434, 454 typically include connective elements for coupling the adapter body 110 to the transmission lines, such as, for example, screw-threaded fittings, snap fittings, pressure release fittings, deformable fittings, quick-release fittings, and any combinations thereof. In one example, the connective element is adapted to mate with threaded connectors on the transmission lines, e.g., transmission lines 108A-B. In another example, the connective element that is used as connective elements 434, 454 are selected from the group of connector interfaces consisting of a BNC connector, a TNC connector, an F-type connector, an RCA-type connector, a 7/16 DIN male connector, a 7/16 female connector, an N male connector, an N female connector, an SMA male connector, and an SMA female connector.

For purposes of example only, it is seen in the example of the adapter 400 of FIG. 4 that the conductive terminals 432, 458 forms a plurality of flexible fingers or tines 470, the dimensions (e.g., outer diameter, inner diameter, and length) of which are so dimensioned so that the fingers 470 of the conductive terminals 432, 458 flexibly expand and contract so as to electrically engage a portion of the transmission line, e.g., the conductor (not shown) of the transmission line 108 (FIG. 1). Moreover, the conductive terminals 432, 458 and the connective elements 434, 454 are arranged so that, when the transmission line is coupled to the adapter via the connective elements 434, 454, the conductive terminals 432, 458 can make electrical contact with the conductor of the transmission line.

Engagement of the threads 442 of the elongated section 426 and the threads 450 of the telescoping section 444 facilitates relative movement between the elongated section 426 and the telescoping section 444. For example, if the elongated section 426 is held in place and the telescoping section 444 is rotated, the threaded engagement will cause telescoping section 444 to translate longitudinally inside of the bore 428. Suitable threads for use as on the threads 442, 450 have from about 20 threads per inch to about 40 threads per inch, although other thread dimensions (e.g., size, type, pitch, and the number of threads per inch) can also be selected in accordance with the desired relative movement between the elongated section 426 and the telescoping section 442. With reference to the non-limiting example mentioned immediately above, the position of the telescoping section 444 relative to the elongated section 426 will change less for each revolution of the telescoping section 444 with respect to the elongated section 426 with threads that have a smaller pitch, and/or more threads per inch.

Conductive materials such as, for example, metals, and conductive plastics are generally preferred for use in the center conductor 412. This includes portions of the fixed conductor 436 and the conductive aperture 452. Exemplary materials for use in the elongated section 426 and the telescoping section 444 include, but are not limited to, metals (e.g., aluminum, steel, brass, etc.), and composites, among many others. Likewise, manufacturing processes implemented to make the components of the adapter 400 include casting, molding, extruding, machining (e.g., turning, and milling) and other techniques that are suitable for forming the elongated section 426 and the telescoping section 444 disclosed and described herein. Because these processes, and the materials that are utilized by such processes, are generally well-known to those having ordinary skill in the art, no additional details will be provided herein, unless such details are necessary to explain the embodiments and concepts of the present invention.

Each of the tuning elements 416A-B is constructed so that the volumetric shape 418 surrounds a portion of the center conductor 412, where the present example of adapter 400 of FIG. 4 has tuning elements 416A-B that surround the fixed conductor 436. It may be desirable that the volumetric shape 418 is dimensioned so that one or more of the tuning elements 416A-B can translate along the longitudinal axis 414. As discussed in connection with FIGS. 5 and 6 below, the volumetric shape 418 may include a hole, bore, or aperture that can receive the fixed conductor 436 so that the tuning elements 416A-B can slidingly engage the fixed conductor 436.

Figure 5:
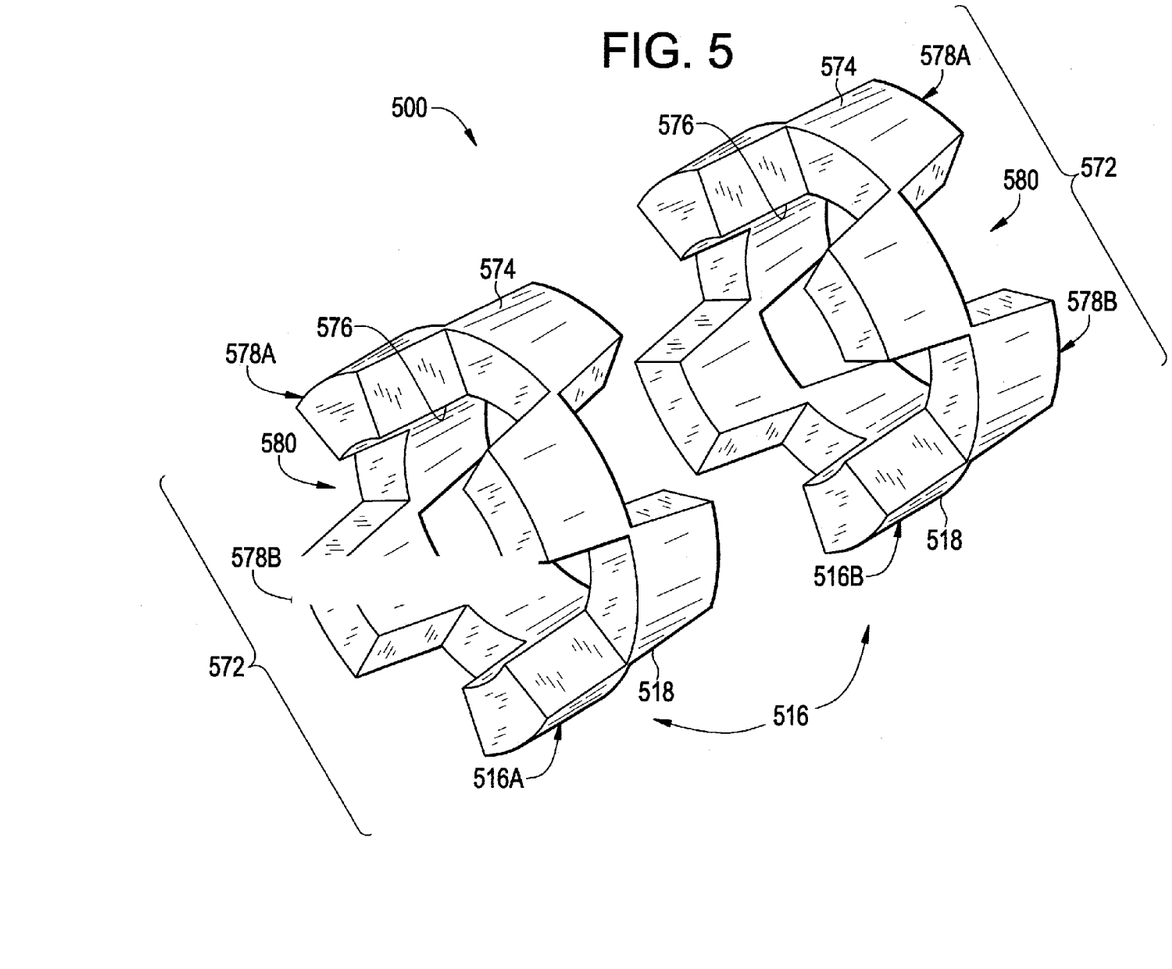
FIG. 5 is a perspective view of a pair of tuning elements, such as the tuning elements of FIGS. 2 and 3.

For example, FIG. 5 illustrates a variable impedance adapter 500 that includes a pair of insulating elements 516, e.g., first insulating element 516A, second insulating element 516B, that each have a volumetric shape 518, where the volumetric shape 518 in this example includes a body 572 that has an outer surface 574 and a bore 576. The body 572 further includes a number of protrusions 578, e.g., protrusions 578A-B, and indentations 580 that are formed in between adjacent ones of the protrusions 578A-B and that are sized to receive at least one of the protrusions 578 therein.

The outer diameter of the body 572 and the inner diameter of the bore 576 are dimensioned so that the tuning elements 516 can be slid into the bore (not shown) of the elongated section (not shown) and in surrounding relation to the center conductor (not shown) of the adapter 500. By way of non-limiting example, one or more of the outer diameter and the inner diameter may be dimensioned so that they frictionally fit with, respectively, the bore and/or the center conductor (not shown). This secures the tuning elements 516A-B at positions inside of the bore of the adapter 500 that correspond to desired values of characteristic impedance for the adapter 500. In preferred embodiments of adapter 500, the relative movement between the elongated section and the telescoping section (not shown) overcomes the frictional fit so as to change the position of one or more of the tuning elements 516A-B. In one example, the telescoping section can force the tuning element 516B towards the tuning element 516A when the telescoping section translates into the bore of the elongated section. In another example, the tuning element 516B is mechanically coupled to the telescoping section so that the tuning element 516B translates along the longitudinal axis 514 in tandem with the telescoping section.

The configuration of the body 572 of the first tuning element 516A permits the first tuning element 516A to intermesh with the second tuning element 516B. In the present example, the protrusions 578A-B and the indentations 580 are provided so that body 572 of the first tuning element 516A and the second tuning element 516B can intermesh when the tuning elements 516A-B are moved within the bore of the adapter 500. This concept of intermeshed tuning elements is illustrated in more detail in connection with FIG. 6 below.

Figure 6:
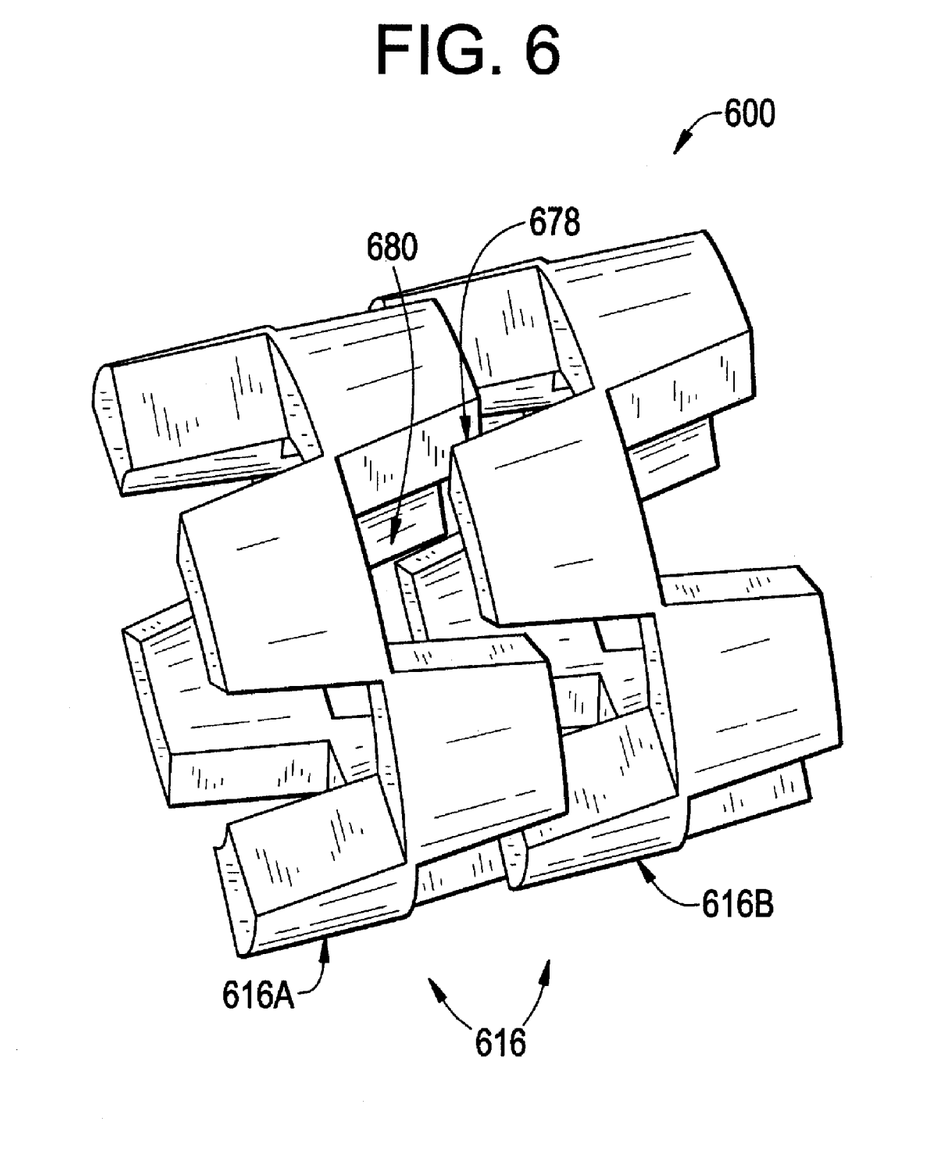
FIG. 6 is a perspective view of another pair of tuning elements, such as the tuning elements of FIGS. 2, 3, and 5.

FIG. 6 illustrates a variable impedance adapter 600 where of the second tuning element 616B is partially intermeshed the first tuning element 616A. More particularly, it is seen in this example the protrusions 678A are aligned with one of the indentations 680 so that the body 672 of the first tuning element 616A can engage the body 672 of the second tuning element 616B. Alternative configurations of the body, e.g., body 672, of the tuning elements are contemplated within the scope and breadth of the present disclosure. These may include, for example, complementary sized cylinders and cubes that can be slid into one another, or in still other alternatives, other arrangements, shapes, and sizes, of the protrusions and indentations.

In view of the foregoing, and with continued reference to FIGS. 5 and 6, the spaced relationship SP5 of FIG. 5 and the spaced relationship SP6 of FIG. 6 correspond to different values of characteristic impedance of the variable impedance adapter. In one example, the difference is about 0.5 ohm. In another example, the value of characteristic impedance for the adapter can change by about +2 ohm to about −2 ohm around the nominal value of characteristic impedance for the system.

It is noted that, although only two insulating elements, e.g., insulating elements 116A-B, 216A-B, 316A-B, 416A-B, 516A-B, and 616A-B, are illustrated in each of the examples of FIGS. 1-5, it is contemplated that other embodiments of the variable impedance adapter may include more (or less) than two insulating elements. Moreover, although not illustrated in figures of the present application, embodiments of the variable impedance adapter are configured to accommodate other spaced relationships between the insulating elements disclosed and described herein. In one example, it may be desirable that adjacent ones of the insulating elements fully intermesh. In another example, it may be desirable that the protrusions and the recesses do no align so that adjacent ones of the insulating elements stand contiguous (or end-to-end). In still another example, it may be desirable that adjacent ones of the insulating elements are spaced apart so that they do not contact one another.

Figure 7:
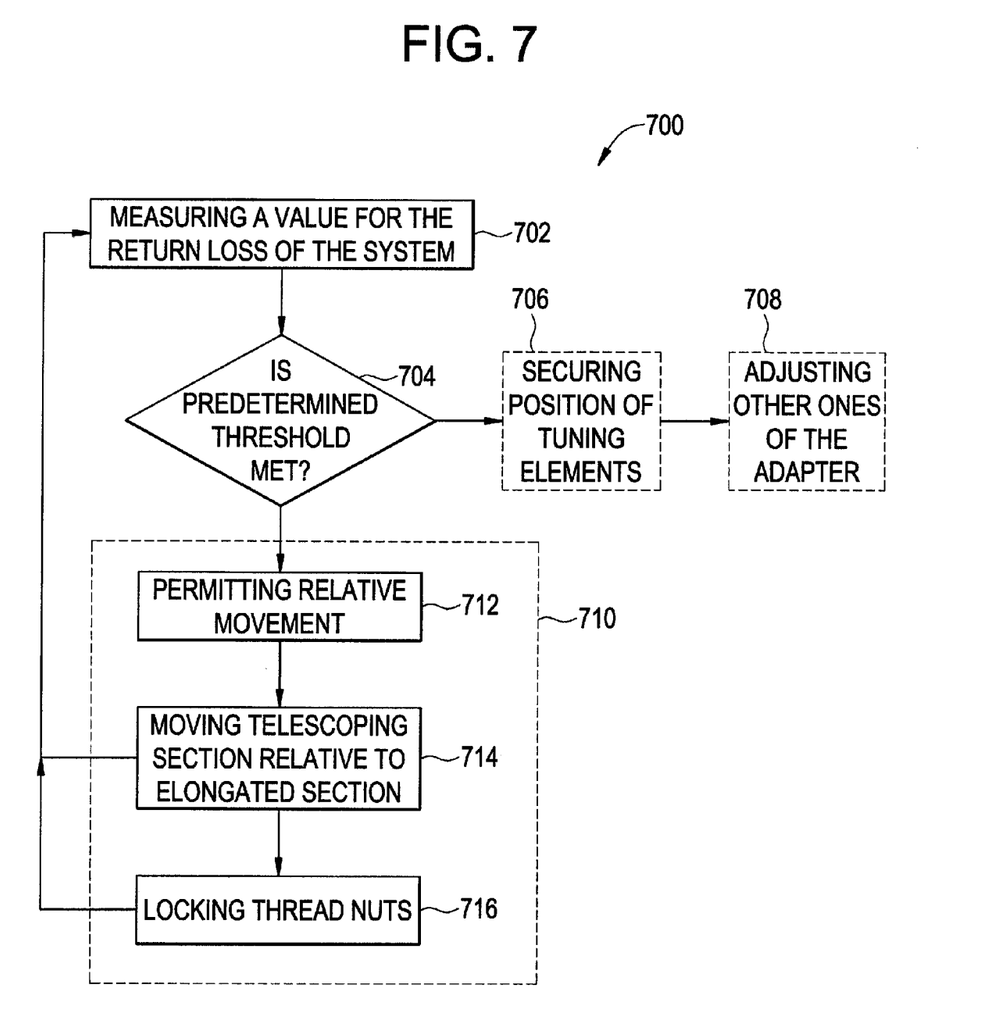
FIG. 7 is a flow diagram of a method of implementing a variable impedance adapter, such as the variable impedance adapters of FIGS. 1, 2, 3, and 4.

Discussing the operation of variable impedance adapters that are made in accordance with concepts of the present invention in more detail, FIG. 7 illustrates a method 700 for adjusting the adapter, e.g., adapter 100, 200, 300, 400, 500, 600, (collectively, "the adapter") to improve the efficiency with which a signal is transmitted between a first component (not shown) and a second component (not shown) via a pair of transmission lines that are connected via the adapter. Here, the method 700 includes, at step 702, measuring a value, e.g., a first value, of the return loss of the system that corresponds to the spaced relationship of the tuning elements. In one example, the value is measured between the first component and the second component with a network analyzer, such as, for example, the Anritsu Site Master™ manufactured by the Anritsu Company of Morgan Hill, Calif.

Next, the method 700 includes, at step 704, determining if the first value is the value for the return loss that is desired. This may include comparing the first value to a pre-determined threshold level. Examples of the pre-determined threshold level include, but are not limited to, a desired value for the return loss, a maximum value for the return loss, and a minimum value for the return loss, among others. In one embodiment of the method 700, if the first value is equal to about the pre-determined threshold level, or alternatively, it is within a specified acceptable deviation, e.g., about ±0.5, of about the pre-determined threshold level, then the method 700 optionally includes, at step 706, securing the position of the turning insulators, e.g., by finally locking the threaded nut to prevent relative movement between the elongated section and the telescoping section, and at step 708, adjusting other ones of the adapter in the system so that the spaced relationship of the tuning elements is substantially consistent across the adapters in the system. In another embodiment of the method 700, if the first value is less than about the pre-determined threshold level, then the method 700 optionally continues to steps 706 and 708. In still another embodiment of the method 700, if the first value is greater than about the pre-determined threshold level, then the method optionally continues to steps 706 and 708.

If the first value does not meet the pre-determined threshold level in one or more of the manners described above, the method includes, at step 710, adjusting the return loss by changing the spaced relationship between the tuning elements of the adapter. This may include, at step 712, permitting relative movement between the elongated section and the telescoping section of the adapter. In one example, the threaded nut is rotated about the inner portion of the adapter body in a manner that permits the telescoping section to move relative to the elongated section. This can be done by hand, or it may require tools, e.g., hand tools, or other devices that can apply a force sufficient to rotate the threaded nut.

The method 700 may also include, at step 714, moving the telescoping section relative to the elongated section. In one example, the elongated section of the adapter body is grasped, or otherwise secured, and the telescoping section is rotated in a manner that overcomes and/or averts the frictional force between the tuning elements and the bore and/or the center conductor. This may be done by hand, such as, for example, by using a finger or fingers to grasp the elongated section, and/or the telescoping section of the adapter body. In another example, the elongated section and/or the telescoping section is grasped, by hand or with hand-tools, and a force is applied that overcomes the frictional forces that retain the tuning elements. Optionally, the method may further include, at step 716, locking the threaded nut to prevent relative movement between the elongated section and the telescoping section.

The method 700 then returns to step 702, measuring a value of the return loss of the system, and another value, e.g., a second value, of the return loss of the system is measured that corresponds to the spaced relationship of the tuning elements. In the present example, the second value is compared to the pre-determined threshold level to determine if the spaced relationship of the tuning elements changed the return loss of the system as desired. If the spaced relationship did not affect the return loss as desired, then the spaced relationship is changed, e.g., in accordance with steps 712-716, and the method 700 continues until the value for the return loss that is measured for the system is the value for the return loss that is desired. Then, as discussed above, the method 700 optionally includes, at step 706, securing the position of the tuning elements, and at step 708, adjusting other ones of the adapter in the system so that the spaced relationship of the tuning elements is substantially consistent across the adapters in the system.

While the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. An adapter for connecting a pair of transmission lines in a system having a nominal value of characteristic impedance, each of the transmission lines in electrical communication to a component in the system, the adapter comprising:
   a center conductor having a longitudinal axis;
   a first elongated section in surrounding relation to the center conductor;
   a second elongated section insertably engaging the first elongated section along the longitudinal axis; and
   a plurality of tuning elements disposed in a spaced relationship on a portion of the center conductor and having a volumetric shape with a width W, at least one of the tuning elements having a plurality of positions on the center conductor including a first position and a second position that is different than the first position, the second position corresponding to a value for the spaced relationship that is less than the sum of the width W of each of the tuning elements;
   wherein relative movement between the first elongated section and the second elongated section causes the first position to change to the second position.

2. The adapter according to claim 1, further comprising a connective element disposed on each of the first and second elongated sections, wherein the transmission lines are connected to the connective elements.

3. The adapter according to claim 1, wherein one of the tuning elements is coupled to the second elongated section.

4. The adapter according to claim 1, wherein at least one the positions corresponds to a value of characteristic impedance that is substantially the same as the nominal value.

5. The adapter according to claim 1, wherein one or more of the tuning elements is made of a compressible material.

6. A method of varying a value of characteristic impedance of an adapter for connecting a first component and a second component in a system having a nominal value of characteristic impedance, comprising:

providing a center conductor having a longitudinal axis;

providing an adapter body in surrounding relation to the center conductor, the adapter body including a first elongated section and a second elongated section insertably engaging the first elongated section; and aligning a plurality of insulating elements on the center conductor in a spaced relationship along the longitudinal axis, each of the insulating elements having a volumetric shape with a width W, at least one of the tuning elements having a plurality of positions on the center conductor including a first position and a second position that is different than the first position, the second position corresponding to a value for the spaced relationship that is less than the sum of the width W of each of the tuning elements;

wherein relative movement between the first elongated section and the second elongated section causes the first position to change to the second position.

7. The method according to claim 6, further comprising coupling at least one of the tuning elements and one or more of the first and second elongated sections.

8. The method according to claim 5, wherein at least one the positions corresponds to a value of characteristic impedance that is substantially the same as the nominal value.

9. The method according to claim 6, wherein one or more of the tuning elements is made of a compressible material.

* * * * *

UNITED STATES PATENT AND TRADEMARK OFFICE
CERTIFICATE OF CORRECTION

| | | |
|---|---|---|
| PATENT NO. | : 8,022,795 B2 | Page 1 of 1 |
| APPLICATION NO. | : 12/418045 | |
| DATED | : September 20, 2011 | |
| INVENTOR(S) | : Noah Montena | |

It is certified that error appears in the above-identified patent and that said Letters Patent is hereby corrected as shown below:

Column 12, Claim 8, Line 10, delete claim "5", insert claim -- 6 --

Signed and Sealed this
Eighth Day of November, 2011

David J. Kappos
*Director of the United States Patent and Trademark Office*